United States Patent
McCarthy et al.

(10) Patent No.: US 6,720,834 B2
(45) Date of Patent: Apr. 13, 2004

(54) TUNABLE RESONANT CIRCUIT AND VOLTAGE CONTROLLED OSCILLATOR USING SAME

(75) Inventors: Evan S. McCarthy, Costa Mesa, CA (US); Jackie Cheng, Irvine, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

(21) Appl. No.: 10/121,366

(22) Filed: Apr. 11, 2002

(65) Prior Publication Data

US 2003/0193373 A1 Oct. 16, 2003

(51) Int. Cl.[7] ................................................. H03B 5/12
(52) U.S. Cl. ............................... 331/117 R; 331/177 V
(58) Field of Search ...................... 331/117 R, 177 V, 331/179, 177 R, 107 R, 36 C

(56) References Cited

U.S. PATENT DOCUMENTS

| | | | |
|---|---|---|---|
| 4,749,961 A | * 6/1988 | Kato et al. | 331/14 |
| 4,929,918 A | 5/1990 | Chung et al. | 331/10 |
| 5,239,213 A | * 8/1993 | Norman et al. | 326/38 |
| 5,532,651 A | 7/1996 | Jager et al. | 331/96 |
| 5,726,608 A | 3/1998 | Arlin | 331/117 D |
| 5,739,730 A | * 4/1998 | Rotzoll | 331/177 V |
| 5,831,482 A | 11/1998 | Salvi et al. | 331/1 R |
| 5,936,474 A | * 8/1999 | Rousselin | 331/34 |
| 5,959,503 A | 9/1999 | Knecht et al. | 331/68 |
| 5,990,752 A | 11/1999 | Papazian et al. | 331/96 |
| 6,133,797 A | 10/2000 | Lovelace et al. | 331/17 |
| 6,147,567 A | 11/2000 | Welland et al. | 331/179 |
| 6,175,282 B1 | * 1/2001 | Yasuda | 331/44 |
| 6,181,225 B1 | 1/2001 | Bettner | 333/235 |
| 6,211,745 B1 | * 4/2001 | Mucke et al. | 331/117 R |
| 6,445,257 B1 | * 9/2002 | Cox et al. | 331/117 R |

* cited by examiner

*Primary Examiner*—Robert Pascal
*Assistant Examiner*—Joseph Chang
(74) *Attorney, Agent, or Firm*—Polit & Erickson, LLC

(57) ABSTRACT

A programmable capacitive network for use in a tunable resonant circuit is set forth that may be used in a number of different applications, but is particularly useful in the tuning of a voltage controlled oscillator formed on a substrate, such as a semiconductor substrate or the like. The programmable capacitive network includes a plurality of capacitive elements. An interconnected network of voltage gate elements and fuse elements are interconnected with the capacitive elements to selectively connect one or more of the plurality of capacitive elements in the resonant circuit in response to at least one program control signal. In accordance with one embodiment, the voltage gate elements are diodes.

23 Claims, 3 Drawing Sheets

TUNABLE RESONANT CIRCUIT AND VOLTAGE CONTROLLED OSCILLATOR USING SAME

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

Oscillators are used in a variety of electronic circuits, such as communication devices, to provide a variety of functions. These functions include, for example, the generation of a local oscillator signal. Radio communication devices, such as portable telephones and the like, require a stable operating frequency provided by the local oscillator. Typically, the output signal of the local oscillator is generated by a voltage controlled oscillator (VCO). It is often difficult to mass-produce such VCO circuits so that they all have the same basic operating frequency (i.e., the same relaxation frequency). This is due to the fact that the operating frequency is strongly dependent on parts tolerances and manufacturing techniques. In general, variation in component tolerance and parasitics as well as variation over temperature requires adjustment of the relaxation frequency in a post assembly process. More particularly, the resonant frequency of a tuned circuit is typically adjusted until the desired relaxation frequency is reached.

Tuned resonant circuits are used in oscillators, such as VCOs, to generate a free running signal at the relaxation frequency. Such resonant circuits are available in a variety of topologies. One commonly used tuned circuit topology employs a microstrip followed by an inductor that, in turn, forms a tuned circuit with a capacitor, which may be in the form of a varactor. The capacitor is frequently formed on a monolithic substrate with other components of the VCO while the inductor is often formed as a discrete component that is separate from the monolithic substrate where it is physically accessible during the manufacturing process. This particular topology is suitable for applications where relaxation frequency is adjusted during the VCO manufacturing process. More particularly, the resonant frequency of the tuned circuit is adjusted by laser trimming the externally disposed inductor/microstrip to vary its physical dimensions.

The trim range of the inductor/microstrip component is proportional to the effective length/width variation of the component resulting from the laser trimming process. This tuning range is constrained by the physical size of the component, the parasitic capacitance, and the degradation of Q factor caused by narrowing the line when tuning.

Current methods of inductive tuning use one or more cuts into a metallized area. This tuning method requires costly capital equipment and can be difficult to implement accurately. Such problems, among others, render this tuning style inefficient. An improved method of tuning resonators and corresponding circuit topology is therefore desired.

BRIEF SUMMARY OF THE INVENTION

A programmable capacitive network for use in a tunable resonant circuit is set forth that may be used in a number of different applications, but is particularly useful in the tuning of a voltage controlled oscillator formed on a substrate, such as a semiconductor substrate or the like. The programmable capacitive network includes a plurality of capacitive elements. An interconnected network of voltage gate elements and fuse elements are interconnected with the capacitive elements to selectively connect one or more of the plurality of capacitive elements in the resonant circuit in response to at least one program control signal. In accordance with one embodiment, the voltage gate elements are diodes.

BRIEF DESCRIPTION OF THE SEVERAL VIEWS OF THE DRAWINGS

The present invention is illustrated by way of example in the following drawings which disclose various embodiments of the present invention for purposes of illustration only and are not intended to limit the scope of the invention.

DETAILED DESCRIPTION OF THE INVENTION

Although the tunable resonant circuit described herein can be used in a variety of different applications, the following discussion will principally focus on its use in the context of a voltage controlled oscillator (VCO). Given the teachings herein, adaptation of the tunable resonant circuit for use in other applications is within the scope of those skilled in the art.

Figure 1A:
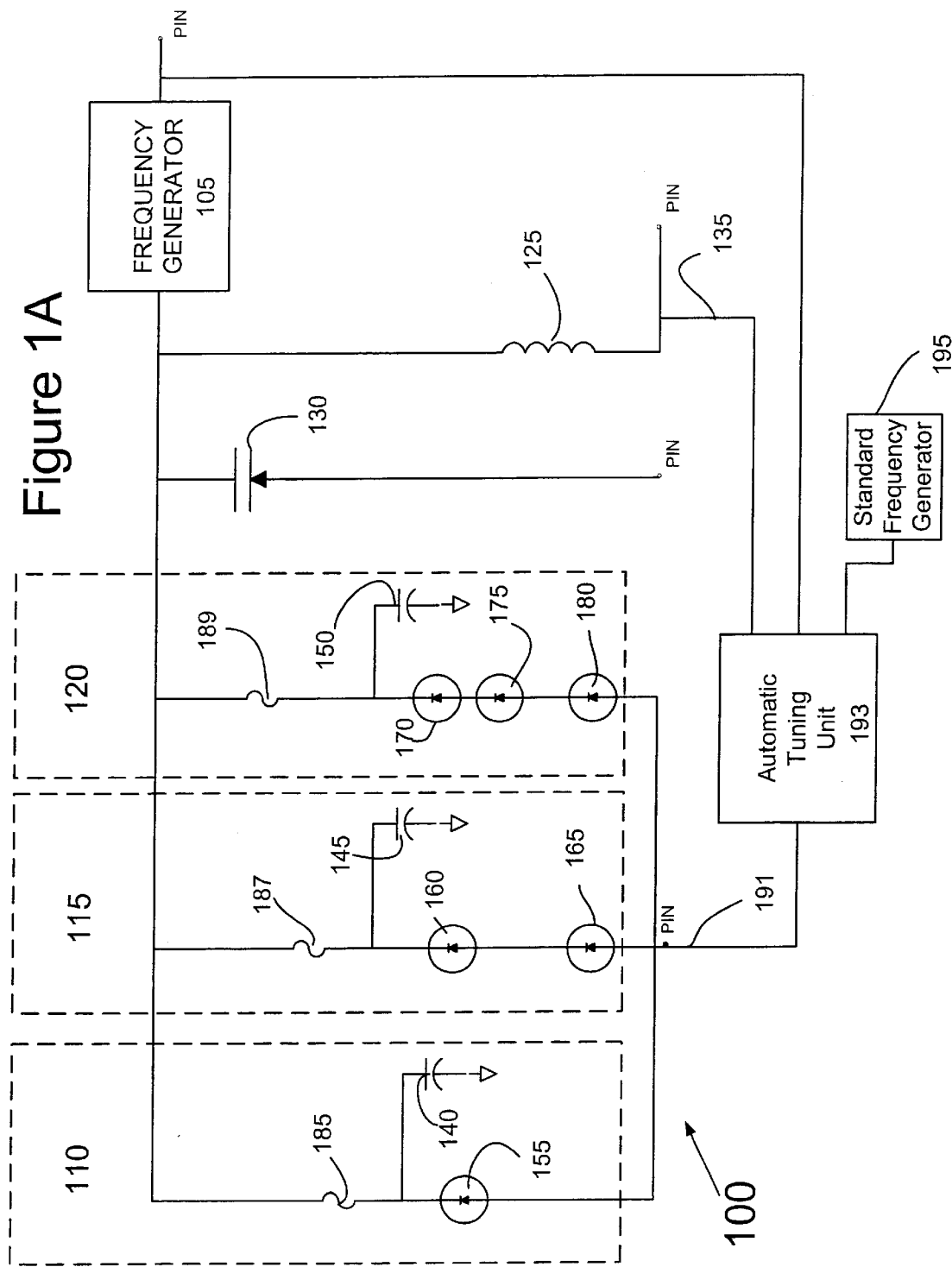
FIG. 1A is a schematic diagram of a circuit that includes a tunable resonant circuit constructed in accordance with one embodiment of the present invention.

FIG. 1A illustrates a VCO, shown generally at 100, that includes one embodiment of a tunable resonant circuit constructed in accordance with the teachings of the present invention. In the embodiment of FIG. 1A, the VCO 100 is comprised of a first resonant circuit having a fixed resonant frequency, a second resonant circuit having a resonant frequency that varies in response to a tuning voltage input signal, and a frequency generator 105 that is responsive to resonant frequencies of the first and second resonant circuits. The first resonant circuit includes a plurality of capacitive circuits 110, 115, 120 that cooperate with an inductive element 125 to provide a circuit that is resonant at the desired relaxation frequency. The second resonant circuit includes, for example, a varactor 130 or other similarly variable capacitive element that likewise cooperates with the inductive element 125 to provide a circuit that is resonant at the desired tuning frequency. More particularly, the desired tuning frequency may be reached by providing a tuning voltage at input line 135 that effectively varies the capacitance of the varactor 130. This variation of the capacitance of the varactor 130, in turn, changes the resonant frequency of the second resonant circuit formed by the varactor 130 and inductive element 125. In the illustrated embodiment, the first and second resonant circuits share a common inductive element 125. However, other applications may indicate the use of separate inductive elements for generating higher-order filter responses.

Each of the capacitive circuits 110, 115 and 120, include a capacitive element 140, 145 and 150 that is selectively connected to inductive element 125 to form the first resonant circuit. The capacitive elements 140, 145 and 150 may have the same capacitance value or different capacitance values depending on the particular application. Selective connection of the capacitive element 140, 145 and 150 is facilitated by a network of electrical elements respectively associated with each capacitive circuit 110, 115 and 120. In the embodiment of FIG. 1A, the network of electrical elements for each of the capacitive circuits 110, 115 and 120, includes voltage gate elements 155 through 180 and fuse elements 185 through 189. In the illustrated embodiment, the fuse elements 185 through 189 connect the capacitive elements 140 through 150, respectively, to a common electrical node with inductive element 125. The voltage gate elements 155 through 180 are each connected to receive a programming signal that is provided at input line 191. The voltage gate elements 155 through 180 are interconnected with the fuse elements 185 through 189 so that the fuse elements effectively blow or remain intact depending on the voltage level of the programming signal.

In the embodiment of FIG. 1A, the voltage gate elements 155 through 180 are in the form of diodes having known voltage drops thereacross. For example, a foreword-biased, conducting diode having a voltage drop on the order of 0.7 V may be used (although diodes having different voltage drops may also be used). In this example, the fuse element 185 associated with capacitive element 140 would be blown to remove capacitive element 140 from the first resonant circuit if a voltage in excess of 0.7 V is applied to the programming signal input line 191. At that voltage level, diode 155 would be placed in a conductive state and the current therethrough would blow fuse 185. If a voltage in excess of two diode voltage drops, i.e. 1.4 V, is applied to the programming signal input line 191, then diodes 160 and 165 as well as diode 155 would be placed in a conductive state thereby blowing both fuse element 185 and 187. Blowing fuse elements 185 and 187 would effectively remove capacitive elements 140 and 145 from the second resonant circuit since they would be disconnected from inductive element 125. Finally, all three of the capacitive elements 140 through 150 would effectively be removed from connection with the inductive element 125 if the programming voltage were made to exceed the value of three diode voltage drops, i.e., 2.1 V. A voltage at this level would cause diodes 170, 175 and 180 to become conductive to blow fuse elements 189 thereby disconnecting capacitive element 150 from electrical connection with inductive element 125.

Figure 1B:
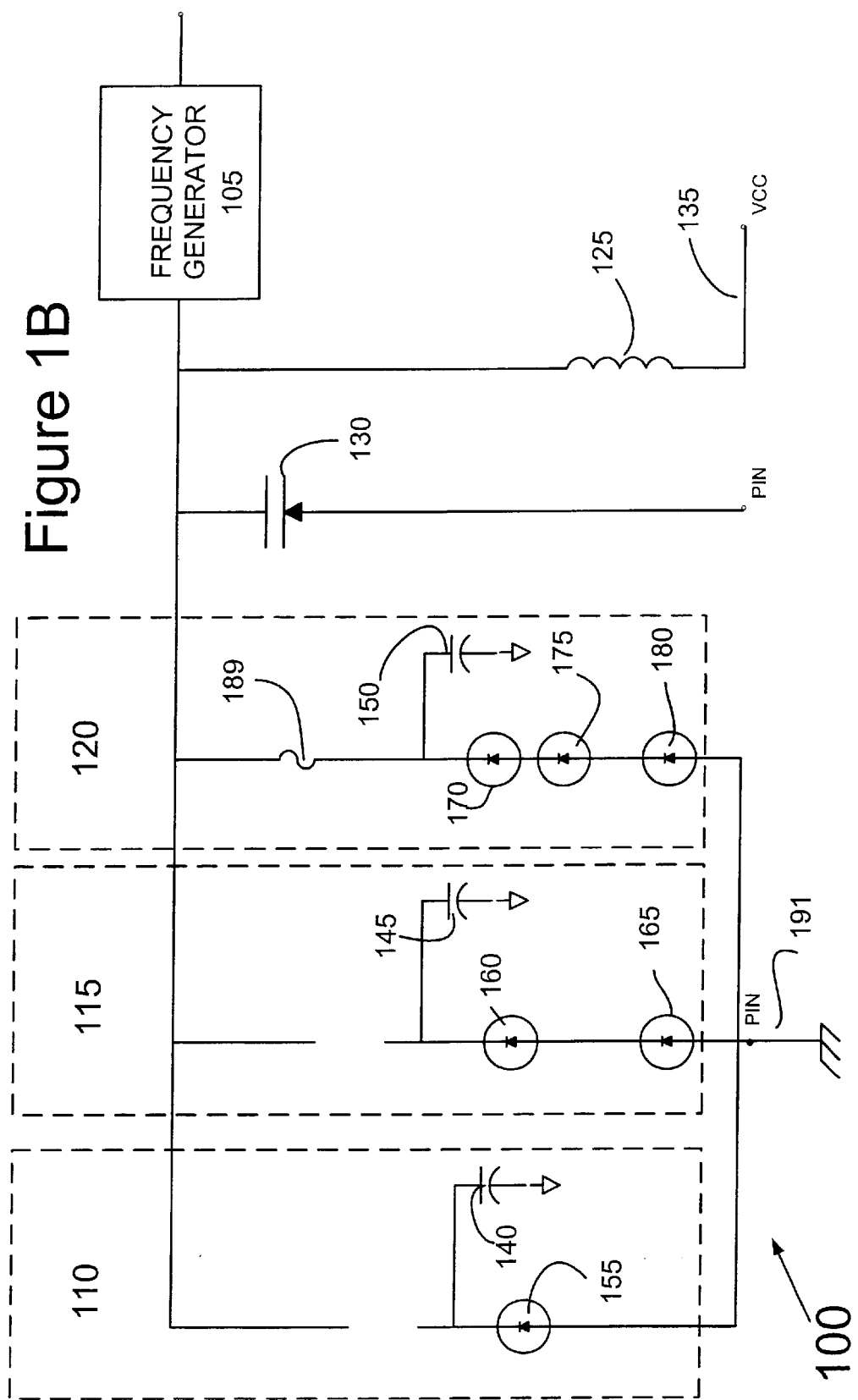
FIG. 1B is a schematic diagram of a circuit that includes a tunable resonant circuit after it has been programmed to operate at a given resonant frequency.

After programming has been completed, the various connections of the VCO circuit may be placed in a post-programming state. An example of this post-programming state is shown in FIG. 1B, which illustrates blown fuses 185 and 187. With fuses 185 and 187 blown, only capacitor 150 remains in the tuned circuit. As shown, signal line 191 is connected to ground and signal line 135 is connected to the voltage supply Vcc to thereby place diodes 170, 175 and 180 into a reverse-biased state. For example, line 191 may be connected to a pin on an integrated circuit package that is ultimately grounded in the circuit in which the integrated circuit package is employed while line 135 may also be connected to a pin on the integrated circuit package that is ultimately connected to the power supply.

It will be recognized that a significantly larger number of capacitive circuits may be employed than are used in the illustrated embodiment. The number of capacitive circuits is dependent on a number of factors, including the tuning resolution needed for the first resonant circuit to accurately tune to the relaxation frequency. Alternatively, it may be desirable to use fewer capacitive circuits in those instances that do not require a high degree of tuning variation/resolution.

The foregoing circuit architecture greatly simplifies and accelerates the VCO manufacturing process. In this regard, capacitive circuits 110 through 120, frequency generator 105 and varactor 130 are easily formed on a monolithic semiconductor substrate while inductive element 125 is easily formed in a separate manufacturing process on a different substrate or the like. Further, since physical access to the inductive element 125 is not necessary in this circuit topology, the inductive element 125 may be formed on the same substrate as the other VCO components. Unlike prior tuning methods used in VCO manufacturing processes that require laser trimming of the inductive element 125, VCO 100 may be tuned to its relaxation frequency merely through the application of a programming voltage. Laser trimming, which can be a tedious and expensive production step, can, if desired, be completely avoided.

The circuit architecture disclosed herein also readily lends itself to an automated to tuning process. One manner of automating the tuning process is illustrated in FIG. 1A. As shown, an automatic tuning unit 193 is used to provide the programming voltage at line 191. The automatic tuning unit 193 generates the programming signal by providing a tuning voltage at line 135 so that varactor 130 has the same capacitance value that it normally would have at the desired relaxation frequency. Under these conditions, the automatic tuning unit 193 compares the output frequency of frequency generator 105 with the frequency of a signal generated by a standard frequency generator 195. Based on this comparison, the automatic tuning unit 193 generates the appropriate programming signal at line 191.

There are a variety of methods that the automatic tuning unit 193 may use to determine the appropriate level for the programming signal. For example, the raw frequency value of the output from the frequency generator 105 may be directly compared to a lookup table or otherwise used in a quantitative calculation to generate programming signal. Alternatively, the raw frequency value may be compared to the output of a frequency generator 195. The difference between the VCO output signal frequency and the frequency of the signal provided by the standard frequency generator 195 may be used by the automatic tuning unit 193 for comparison with a lookup table or use in a quantitative calculation. Still further, this difference may be used in a closed-loop analog feedback system. It will be recognized that the foregoing automatic tuning methods are merely exemplary and that other automatic tuning methods based on the principals disclosed herein may be employed.

Figure 2:
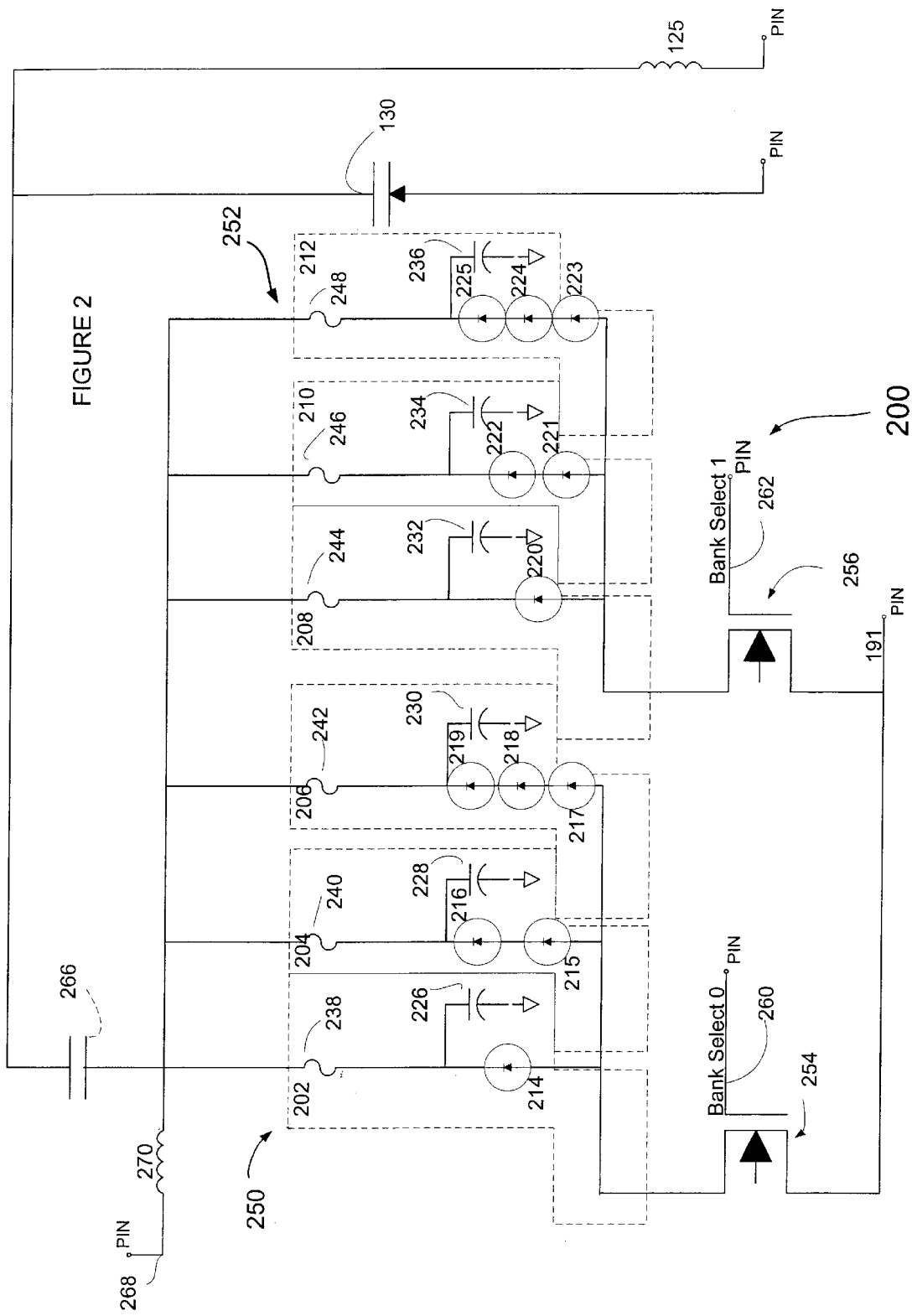
FIG. 2 is a schematic diagram of a circuit that includes a tunable resonant circuit constructed in accordance with a further embodiment of the present invention.

FIG. 2 illustrates a further tunable resonant circuit, shown generally at 200, having several features that differ from the circuit of FIG. 1A. In accordance with the embodiment of FIG. 2, a plurality of capacitive circuits 202 through 212 are employed for selectively coupling capacitive elements with inductive element 125 and varactor 130 to form a resonant circuit that is tuned to a given target frequency. Like the foregoing embodiment of FIG. 1A, the capacitive circuits 202 through 212 of this embodiment each include one or more diodes that function as the voltage gate element. The voltage gate elements are responsive to the signal at line 191 to blow/leave intact the connection between the respective capacitor and the inductive element 125. For example, a programming voltage that exceeds a single diode voltage drop can be used to blow fuse 238 thereby disconnecting capacitive element 226 from the resonant circuit. A programming voltage that exceeds two diode voltage drops can be used to blow both fuse element 238 and fuse element 240 thereby disconnecting both capacitive elements 226 and 228 from the resonant circuit.

In accordance with the embodiment of FIG. 2, the capacitive circuits are arranged in capacitive circuit banks. More particularly, capacitive circuits 202 through 206 are interconnected to form a first capacitive circuit bank 250 while capacitive circuits 208 through 212 are arranged to form a second capacitive circuit bank 252. The programming voltage at line 191 is provided to the input of a given bank through a corresponding bank selection switch. In this example, capacitive circuit bank 250 is provided with the programming voltage at line 191 through a first bank selection switch 254 when the bank selection switch is actuated by a bank selection signal at bank selection line 260. Similarly, capacitive circuit bank 252 is provided with the programming voltage at line 191 through a second bank selection switch 256 when the bank selection switch is actuated by a bank selection signal at bank selection line 262.

Bank selection switches 254 and 256 may be constructed from field effect transistors that are readily formed in a semiconductor substrate along with the capacitive circuits and varactor. Further, the programming voltage line 191 and bank selection lines 260 and 262 may be connected to external pins of an integrated circuit package to facilitate tuning of the resonant circuit during the manufacturing process.

The circuit of FIG. 2, in contrast to the circuit of FIG. 1A, is shown in an optional configuration in which the capacitance added by non-blown capacitive circuits effectively reduces the overall capacitance of the resonant circuit. To this end, the fuse elements 238 through 248 of the capacitive circuits 202 through 212 are connected to place the respective capacitive elements 226 through 236 in series with a primary capacitor 266. The remaining lead of the primary capacitor 266, in turn, is connected to a node that includes the varactor 130 and inductive element 125. The repercussions of this design, however, indicate the creation of a DC path for blowing the desired fuse elements. In the illustrated embodiment, the DC path includes a bond pad 268 and an external choke 270. Alternatively, the external choke 270 may be replaced or supplemented with a diode.

The embodiment illustrated in FIG. 2 may be subject to an automatic tuning process such as the one set forth above in connection with the embodiment of FIG. 1A. Alternatively, a manual or semi-manual tuning process may be employed. An exemplary tuning process, automated or manual, may be conducted in accordance with the following tuning sequence:

Let the device that includes the resonant circuit run at a predetermined control voltage while the frequency of the output is measured.

Switch off the device and ground the "pin" on the external choke.

Apply a programming voltage at a level that has been calculated from the measured frequency output. This will cause current to flow through some of the diodes and blow the appropriate fuses thus decreasing (FIG. 2) or increasing (FIG. 1A) the capacitance.

Execute a final test on the part, verifying that the device operates at the target frequency (i.e., the relaxation frequency).

Ground the programming pin to put the diodes of the capacitive circuits in a reverse bias state to minimize their capacitive loading.

Connect the external choke to a voltage, such as Vcc.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. In a tunable resonant circuit, a programmable capacitive network comprising:
   a plurality of capacitive elements;
   a program control signal input;
   an interconnected network of voltage gate elements and fuse elements, at least two of said voltage gate elements being responsive to different predetermined voltage levels of a signal at said program control signal input to selectively blow said fuse elements at the different predetermined voltage levels and thereby selectively connect or disconnect the one or more of the plurality of capacitive elements in the resonant circuit.

2. A programmable capacitive network as claimed in claim 1 wherein the voltage gate elements are diodes.

3. A programmable capacitive network as claimed in claim 2 wherein the diodes are selectively forward biased in response to the voltage level of the signal at said program control signal input to thereby conduct current therethrough to selectively blow the corresponding fuse elements whereby selected capacitive elements of the plurality of capacitive elements are electrically connected or disconnected from the resonant circuit.

4. A programmable capacitive network as claimed in claim 3 wherein blowing of one or more fuse elements increases the capacitance of the capacitive network.

5. A programmable capacitive network as claimed in claim 3 wherein blowing of one or more fuse elements decreases the capacitance of the capacitive network.

6. A programmable capacitive network as claimed in claim 3 wherein the interconnected network selectively connects or disconnect the one or more of the plurality of capacitive elements in the resonant circuit in a generally concurrent manner in response to the voltage level of the signal at a single program control signal input.

7. A programmable capacitive network as claimed in claim 1 wherein the interconnected network selectively connects or disconnects the one or more of the plurality of capacitive elements in the resonant circuit in a substantially concurrent manner in response to the voltage level of the signal at a single program control signal input.

8. In a tunable resonant circuit, a programmable capacitive network comprising:
   a plurality of capacitive circuits disposed for selective coupling in the tunable resonant circuit in response to the voltage level of at least one signal provided to at least one program control signal input, each of the plurality of capacitive circuits including
   a capacitive element,
   a fuse element,
   a voltage gate circuit operating to conduct a current through the corresponding fuse element in response to a predetermined voltage level of the signal provided at said at least one program control signal input,
   the capacitor, the fuse element, and the voltage gate being connected so that current flowing through the fuse element when the voltage level of the signal at said at least one program control signal input reaches the predetermined voltage level blows the respective fuse element to electrically connect or disconnect the capacitor from the tunable resonant circuit; and wherein said voltage gate of at least two of said plurality of capacitive circuits are responsive to different predetermined voltage levels of said signal provided to said program control signal input to thereby electrically connect or disconnect the respective capacitive elements from the tunable resonant circuit based on said different predetermined voltage levels.

9. A programmable capacitive network as claimed in claim 8 wherein blowing of one or more fuse elements increases the capacitance of the tunable resonant circuit.

10. A programmable capacitive network as claimed in claim 8 wherein blowing of one or more fuse elements decreases the capacitance of the tunable resonant circuit.

11. A programmable capacitive network as claimed in claim 8 wherein the voltage gate circuits respectively associated with the plurality of capacitive circuits conduct current therethrough in response to different predetermined voltage levels of the signal provided at a single program control signal input.

12. A programmable capacitive network as claimed in claim 8 wherein the voltage gate element comprises at least one diode that is forward biased when the voltage level of the signal provided at said at least one program control signal input reaches the predetermined level.

13. A programmable capacitive network as claimed in claim 8 wherein the voltage gate element of at least one of the plurality of capacitive circuits comprises a plurality of series connected diodes.

14. A programmable capacitive network as claimed in claim 13 wherein only a single terminal of one of the series connected diodes is connected to a common node with the fuse element.

15. A voltage controlled oscillator comprising:
a first resonant circuit having a fixed resonant frequency, the first resonant circuit including,
a plurality of capacitive elements,
a program control signal input,
an interconnected network of voltage gate elements and fuse elements, at least two of said voltage gate elements being responsive to different predetermined voltage levels of a signal at said program control signal input to selectively blow said fuse elements at the different predetermined voltage levels and thereby allow selective connection of the one or more of the plurality of capacitive elements in the resonant circuit;
a second resonant circuit having a resonant frequency that varies in response to a tuning voltage input signal;
a frequency generator responsive to the resonant frequency of at least the first resonant circuit to generate an output signal at a relaxation frequency of the voltage controlled oscillator and also responsive to the resonant frequency of the second resonant circuit to change the frequency of the output signal from the relaxation frequency in response to variations in the tuned frequency of the second resonant circuit.

16. A voltage controlled oscillator as set forth in claim 15 wherein the capacitive elements are arranged in capacitive element banks and further comprising one or more bank switches connected to selectively provide the at least one program control signal input to one or more of the capacitive element banks in response to one or more bank selection signals.

17. A voltage controlled oscillator as claimed in claim 15 wherein the voltage gate elements are diodes.

18. A voltage controlled oscillator as claimed in claim 17 wherein the diodes are selectively forward biased in response to the voltage level of the signal at said program control signal input to thereby conduct current therethrough and blow the corresponding fuse elements whereby blowing of the fuse elements causes selective capacitive elements of the plurality of capacitive elements to be electrically disconnected from at least one inductive element.

19. A voltage controlled oscillator as claimed in claim 15 wherein the network of electrical elements selectively connects the one or more of the plurality of capacitive elements with at least one inductive element in response to the voltage level of the signal at said at least one program control signal input.

20. In a tunable resonant circuit, a programmable capacitive network comprising:
a plurality of capacitive circuits disposed for selective coupling in the tunable resonant circuit in response to at least one program control signal, each of the plurality of capacitive circuits including
a capacitive element,
a fuse element,
a voltage gate circuit operating to conduct a current to a respective fuse element in response to the voltage level of said at least one program control signal,
the capacitive element, the fuse element, and the voltage gate circuit being connected so that the voltage gate circuit respectively associated with the capacitive elements directs current to the respective fuse element when said at least one program control signal is at a predetermined voltage level, said current blowing the respective fuse to thereby connect or disconnect the capacitive element with the tunable circuit;
voltage gate circuits of at least two of said plurality of capacitive circuits directing current through the respective fuses at different predetermined voltage levels of the program control signal.

21. A programmable capacitive network as claimed in claim 20 wherein the voltage gate element of at least one of the plurality of capacitive circuits comprises a plurality of series connected diodes.

22. A programmable capacitive network as claimed in claim 21 wherein only a single terminal of one of the series connected diodes is connected to a common node with the fuse element.

23. In a tunable resonant circuit, a programmable capacitive network comprising:
a plurality of capacitive circuits disposed for selective coupling in the tunable resonant circuit in response to at least one program control signal, each of the plurality of capacitive circuits including
a capacitive element,
a fuse element,
a plurality of series connected diodes connected to form a voltage gate circuit that operates to conduct a current therethrough in response to a predetermined voltage level of said at least one program control signal, at least two of the plurality of capacitive circuits having voltage gates comprised of a different number of series connected diodes so as to be conductive in response to different predetermined voltage levels of said at least one program control signal;
the capacitive element, the fuse element, and the voltage gate circuit being connected so that conduction of current through the voltage gate circuit blows the respective fuse and connects or disconnects the capacitive element with the tunable circuit.

* * * * *